United States Patent [19]

Kobayashi

[11] Patent Number: 5,552,616
[45] Date of Patent: Sep. 3, 1996

[54] SEMICONDUCTOR LIGHT DETECTING DEVICE WITH GROOVE

[75] Inventor: Masahiro Kobayashi, Kawasaki, Japan

[73] Assignee: Fujitsu Limited, Kawasaki, Japan

[21] Appl. No.: 568,793

[22] Filed: Dec. 7, 1995

Related U.S. Application Data

[63] Continuation of Ser. No. 400,522, Mar. 7, 1995, abandoned, which is a continuation of Ser. No. 213,508, Mar. 16, 1994, abandoned.

[30] Foreign Application Priority Data

Mar. 19, 1993 [JP] Japan .................. 5-60103

[51] Int. Cl.$^6$ .................... H01L 31/00
[52] U.S. Cl. .................. 257/184; 257/458; 257/465; 257/466
[58] Field of Search ............... 257/458, 184, 257/185, 186, 187, 465, 466, 438

[56] References Cited

U.S. PATENT DOCUMENTS 4,857,982  8/1989  Forrest .................. 257/495 X
5,304,824  4/1994  Tonai .................... 257/458 X
5,332,919  7/1994  Fujimura ................ 257/465 X

FOREIGN PATENT DOCUMENTS

| 59-02379 | 1/1984 | Japan | 257/466 |
| 60-258980 | 12/1985 | Japan . | |
| 61-156777 | 7/1986 | Japan | 257/438 |
| 63-122180 | 5/1988 | Japan . | |
| 5-29712 | 2/1993 | Japan . | |

Primary Examiner—William Mintel
Attorney, Agent, or Firm—Staas & Halsey

[57] ABSTRACT

A light detecting device of the present invention comprises a third semiconductor layer containing a second conductive impurity which is formed in the upper part of a semiconductor layer containing a first conductive impurity and a fourth semiconductor layer containing the second conductive impurity which is formed in the semiconductor layer around the third semiconductor layer with an interval between the layers.

9 Claims, 9 Drawing Sheets

INPUT WAVEFORM

OUTPUT WAVEFORM

SEMICONDUCTOR LIGHT DETECTING DEVICE WITH GROOVE

This application is a continuation of U.S. patent application Ser. No. 08/400,522, filed Mar. 7, 1995, now abandoned, which is a continuation of U.S. patent application Ser. No. 08/213,508, filed Mar. 16, 1994, now abandoned.

BACKGROUND OF THE INVENTION

1. Field of the Invention

The present invention relates to a semiconductor light detecting device, and specifically to a semiconductor light detecting device for monitoring a laser output of a semiconductor laser which is mounted on a module having the semiconductor laser on it.

A semiconductor laser varies in its optical output under the influence of heat generation of the device itself, the ambient temperature around it, and the like even if its driving current is kept constant.

As a method for keeping an output of a semiconductor laser constant, it is known to control a driving current of the semiconductor laser through an automatic power control (APC) circuit so that output current of a light detecting device may be kept constant which is disposed behind the semiconductor laser as a monitoring light detecting device and is irradiated with the light outputted from the rear part of the semiconductor laser. The method of keeping the output of a semiconductor laser in such a manner as this is described in Japanese First Publication Tokkaihei 5-29712, for example.

The APC circuit, for example, is made to monitor the output of the semiconductor laser by measuring the average output current of the light detecting device in a period and feed it back into the laser diode driving circuit.

A pin photodiode as shown in FIGS. 1A and 1B, for example, is used as the light detecting device for monitoring. FIG. 1A is a plan view of the photodiode and FIG. 1B is a cross-sectional view of it.

In the Figures, an $n^-$-type InGaAs layer 102 and an $n^-$-type InP layer 103 are formed on an $n^+$-type InP substrate 101 in order, and a $p^+$-type diffusion layer 104 which acts as an active area is formed in the $n^-$-type InP layer 103. The $n^-$-type InP layer 103 is covered with a passivation film 105 of silicon nitride, and an opening 106 is formed in the passivation film 105 on the circumference part of the $n^+$-type diffusion layer 104, and an p-electrode 107 formed on the passivation layer 105 is connected with the $p^+$-type diffusion layer 104 through the opening 106. An n-electrode 108 is formed under the $n^+$-type InP substrate 101.

Light outputted from the rear part of the semiconductor laser is irradiated almost all over the face of the light detecting device for monitoring which is shown in FIGS. 1A and 1B.

Electrons and holes are generated inside the light detecting device by irradiation of the light. The electrons are moved to an n-type domain (the $n^+$-type InP substrate 101) through an electric field generated by a diffusion potential of the pn junction, while the holes flow into a p type domain (the $p^+$-type impurity diffusion layer 104).

Electrons and holes generated in a region distant from the depletion layer which exists in the vicinity of the interface between the $p^+$-type diffusion layer 104 and both of the $n^-$-type InGaAs layer 102 and the $n^-$-type InP layer 103 reach the depletion layers through diffusion, but it takes an extra time for these electrons and holes to reach there, so they become slow components in respect of response speed.

Since the slow components can scarcely respond to high frequency input though they can response to low frequency input, their response falls in a range of high frequency. As a result their frequency vs. response characteristic deviates from the preferable curve B of flatness shown in FIG. 2 to show the curve A. When the frequency vs. response characteristic is not flat, even if an optical pulse signal of rectangular waveform shown in FIG. 3A is inputted into the light detecting device, its output waveform comes to be distorted as shown in FIG. 3B. Therefore, since it is impossible to faithfully monitor output of the semiconductor laser, it is difficult to control the semiconductor laser in real time.

If a distance L from the side face of the light detecting device to its active area ($p^+$-type diffusion laser 104) is made short in order to decrease the number of slow-response carriers to be generated, electrons and holes generated in the outside of a depletion layer can reach the depletion layer in a shorter time, and as a result the response of the device can be made faster, so flatness of the frequency vs. response characteristic is improved.

There is a problem, however, that dark current is increased if the distance L between the active area and the side face of the light detecting device is shortened. A result of measurement of the dark current characteristic by the inventors is described later.

An object of the present invention is to provide a light detecting device for monitoring which is better in frequency vs. response characteristic and less in dark current.

The light detecting device of the present invention comprises a first semiconductor layer containing a first conductive impurity, a second semiconductor layer containing a first conductive impurity which is lower in density than the first semiconductor layer and is formed on the first semiconductor, a third semiconductor layer containing a second conductive impurity which is formed in the upper part of the second semiconductor layer in the active area, and a fourth semiconductor layer containing a second conductive impurity which is formed around the third semiconductor layer with an interval between the third semiconductor layer and the fourth semiconductor layer. The first conductive impurity is one of n-type and p type impurities, and the second conductive impurity is the other of them.

When the second semiconductor layer of the light detecting device is irradiated with light, pairs of electrons and holes are formed in the second semiconductor layer, and they are moved by a diffusion potential and a reverse bias voltage. Electrons or holes generated in the outside of depletion layer around the third semiconductor layer reach the third semiconductor layer at a slow speed, but in the case that the semiconductor layer outside the third semiconductor layer is small in area, the number of carriers is small, so the frequency vs. response characteristic of output of the light detecting device becomes flat.

The light detecting device of the present invention remarkably reduces the dark current in comparison with a light detecting device having no fourth semiconductor layer. The reason for this is as follows.

There are many nuclei of generation and recombination on the end face of a compound semiconductor layer of a light detecting device. Since carriers generated here flow into the depletion layer of pn junction through a channel formed in a hetero interface of the semiconductor layer, dark current is generated. When a barrier of pn junction is formed in the middle of the channel as in this invention, it is difficult for the carriers to move to the depletion layer because of obstruction of the channel and thus the dark current is reduced.

The longer the distance for the carriers to diffuse is, the slower the response of the output current is. Therefore, the shorter the distance between the third and fourth semiconductor layers are, the better the response is. The smaller a ratio of the number of carriers generated outside the depletion layer to the number of carriers generated in the depletion layer around the third semiconductor layer is, the better the response in high frequency is improved.

Carriers generated outside the depletion layer is reduced by making thinner the semiconductor layer in the outside of the third semiconductor layer. Reflectivity of the surface of the semiconductor layer in the outside of the third semiconductor layer is improved by controlling thickness of the protection film of the surface of the semiconductor layer. Thus, by carriers generated outside the depletion layer are reduced.

DESCRIPTION OF THE PREFERRED EMBODIMENTS (First Embodiment)

A manufacturing process of a light detecting device (pin photodiode) in a first embodiment of the present invention is described on the basis of FIGS. 4A to 4D.

Figure 4A:
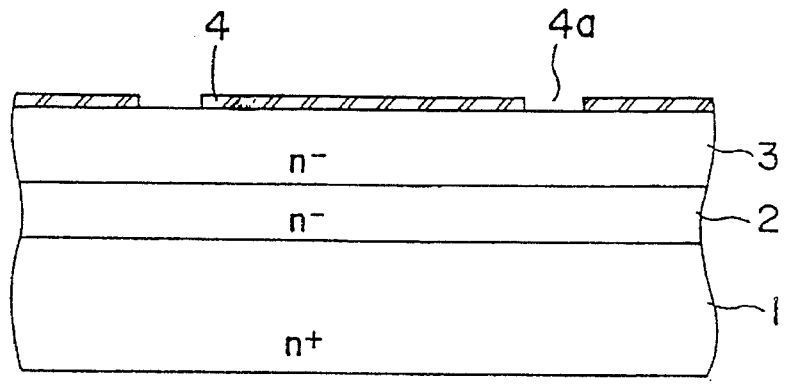
FIGS. 4A to 4D are cross-sectional views showing a manufacturing process of a light detecting device of a first embodiment of the present invention.

First, as shown in FIG. 4A, an $n^-$-type InGaAs layer 2 of 2.5 μm in thickness and an $n^-$-type InP layer 3 of 1.5 μm in thickness are formed one after another on an $n^+$-type InP substrate 1 by using of a metal organic chemical vapor deposition (MOCVD). The InP substrate 1 contains an n-type impurity of $2 \times 10^{15}$/cm$^3$ in density, and the InGaAs layer 2 and InP layer 3 respectively contain n-type impurities of $2 \times 10^{15}$/cm$^3$ in density. Silicon, selenium, tin, and the like can be used as the n-type impurity. The energy band gap of the InGaAs layer 2 is smaller than that of the InP layer 3.

Next, after a first silicon nitride film 4 is formed up to about 200 μm in thickness by using a CVD, a first opening 4a is formed in a part surrounding a domain to form the device in it by patterning the first silicon nitride film 4 by means of a photolithography method. The first opening 4a has a shape of ring of about 40 μm in pattern width in a plan view.

Figure 4B:
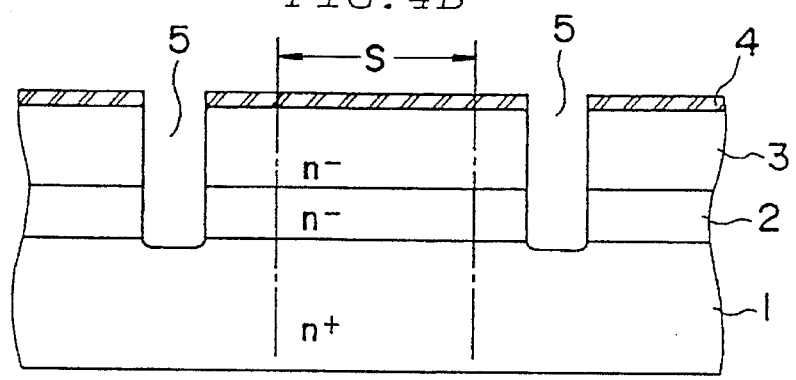

Then as shown in FIG. 4B, a trench 5 is formed by almost vertically etching the layers under the first opening 4a from the InP layer 3 to the obverse surface layer of the InP substrate 1. The device forming domain surrounded by the trench 5 is nearly in a shape of a rectangle of 290×290 μm$^2$.

After this, a second opening 4b is formed in an active area S by patterning again the first silicon nitride film 4 by means of the photolithography method. The second opening 4b is formed in size nearly equal to the area of a circle of 300 μm in diameter, for example, in a shape of rectangle of about 270×270 μm$^2$.

Figure 4C:
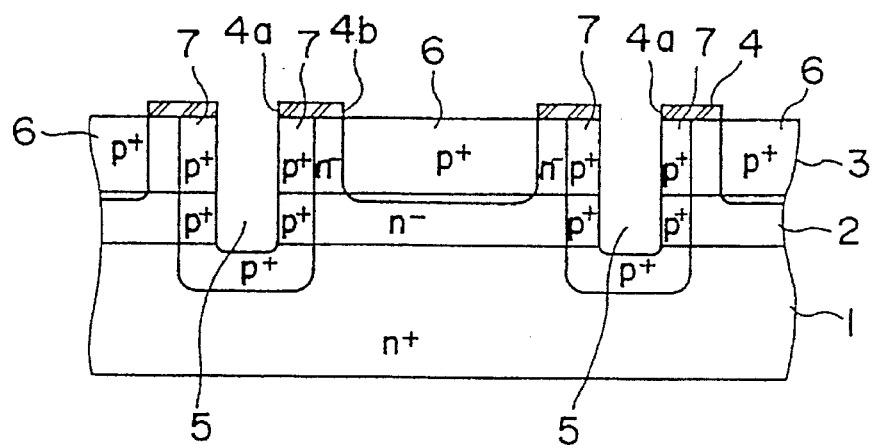

Next, as shown in FIG. 4C, by making thermal diffusion of a p type impurity through the first and second openings 4a and 4b, the $n^-$-type InP layer 3 and the obverse surface layer of the $n^-$-type InGaAs layer 2 which are in the active area S is changed into p type to be turned into a $p^+$-type InP layer (a first $p^+$-type impurity doped semiconductor layer) 6, and at the same time the $n^-$-type InP layer 3, $n^-$-type InGaAs layer 2 and $n^+$-type InP layer 1 which are in a range of about 10 μm in depth from the inside wall of the trench 5 are changed into p type to be turned into a $p^+$-type diffusion layer (a second $p^+$-type impurity doped semiconductor layer) 7. The impurity density of the $p^+$-type InP layer 6 and the $p^+$-type diffusion layer 7 is $2 \times 10^{18}$ to $3 \times 10^{18}$/cm$^3$. Zinc, cadmium, beryllium, and the like can be used as the p type impurity.

Figure 4D:
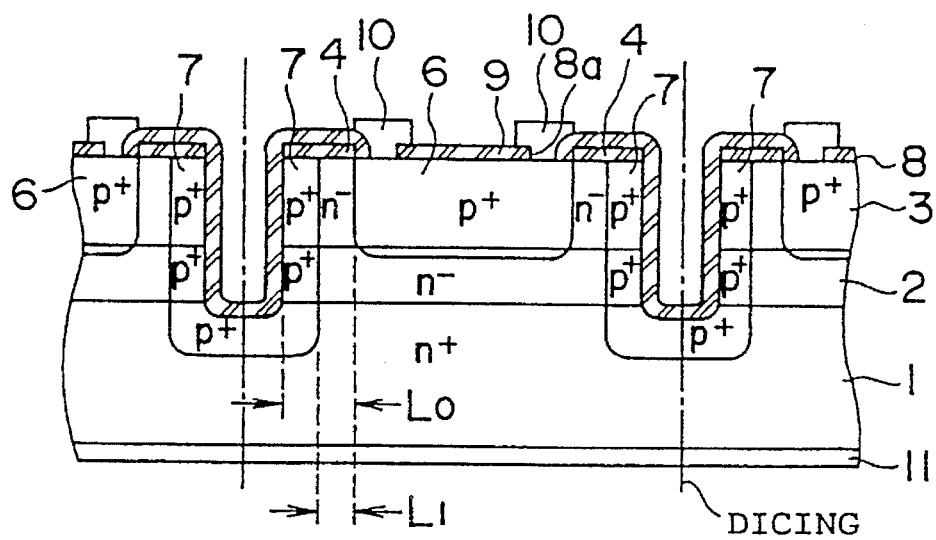

Then, as shown in FIG. 4D, a second silicon nitride film 8 is formed on the upper surfaces of the $n^-$-type InP layer 3 and $p^+$-type InP layer 6 and on the inside surface of the trench 5 by means of the CDV method. The silicon nitride film acts as an antireflection film 9 in the active area S by being formed up to a thickness of ¼ of wavelength λ.

Next, a third opening 8a being ring-shaped in a plan view is formed in the vicinity of the circumference part of the active area S by patterning the second silicon nitride film 8 by means of photolithography, and thus the $p^+$-type InP layer 6 is exposed through the third opening 8a.

Then a titanium film, platinum film, and gold film are formed one after another on the second silicon nitride film 8 and in the third opening 8a by means of a sputtering method. And a p-electrode 10 led from the inside of the third opening 8a by patterning these metal films. Such a method as photolithography, lift-off, or the like is used as the patterning method.

Furthermore, a gold film and germanium film are formed one by one on the under surface of the $n^+$-type InP substrate 1 to make an n-electrode 11.

Figure 5:
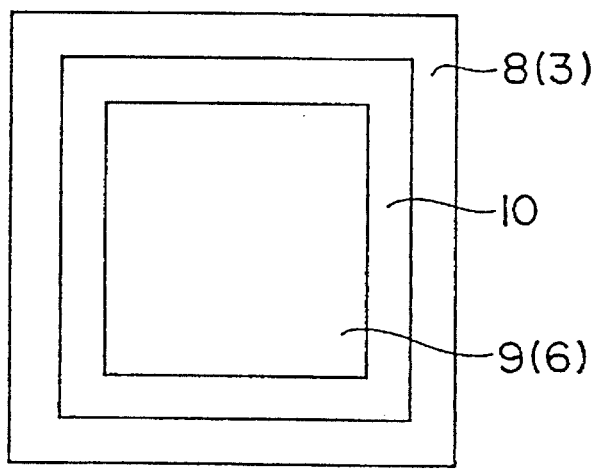
FIG. 5 is plan view showing the light detecting device of the first embodiment of the present invention.

After this, a light detecting device is completed by dicing the InP substrate 1 and each semiconductor layer on it along the trench 5. A plan view of it is shown in FIG. 5.

In the light detecting device as mentioned above, when a reverse bias voltage $V_R$ is applied between the p-electrode 10 and n-electrode 11 and furthermore the antireflection film 9 is irradiated with light from the outside, pairs of electrons and holes are generated mainly in the $n^-$-type InGaAs layer 2. At this time the electrons are moved to the n-electrode 11 through the $n^+$-type InP substrate 1 by the diffusion potential and electric field, while the holes are moved to the p-electrode 10 through the $p^+$-type InP layer 6, and in this way electric current passes.

In the $n^-$-type InGaAs layer 2 and $n^-$-type InP layer 3 which are around the depletion layer outside the $p^+$-type InP layer 6, pairs of electron and hole are generated by irradiation of a light passing through the $p^+$-type InP layer 6 and a light passing through the first and second silicon nitride films 4 and 8. These electrons and holes are moved to the $p^+$-type InP layer 6 and the $n^+$-type InP substrate 1 with some delay.

Figure 6:
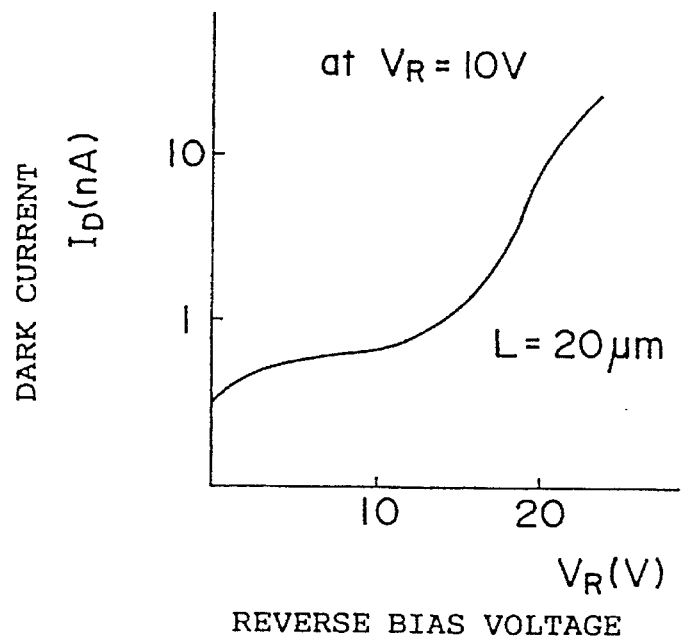
FIG. 6 is a characteristic graph showing relation between dark current and reverse bias voltage in the light detecting device of the first embodiment of the present invention.

When the relation between the reverse bias voltage and the dark current was investigated as setting the distance $L_0$ from the side face of the $p^+$-type InP layer 6 to the side face of the light detecting device as 20 µm, a characteristic curve as shown in FIG. 6 was obtained. Since a range of the reverse bias voltage is usually from 0 to 10 volt, the dark current in this range is as minute as 1 Na or less.

Figure 1A:
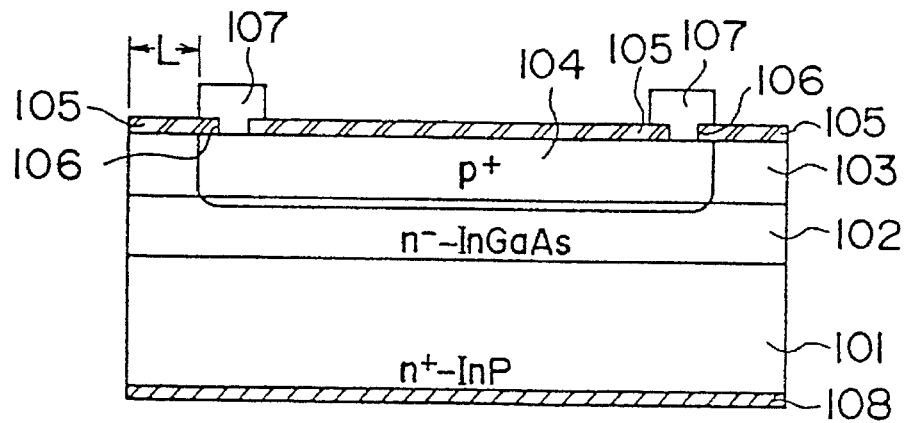
FIG. 1A is a cross-sectional view of a light detecting device according to a prior art.
Figure 1B:
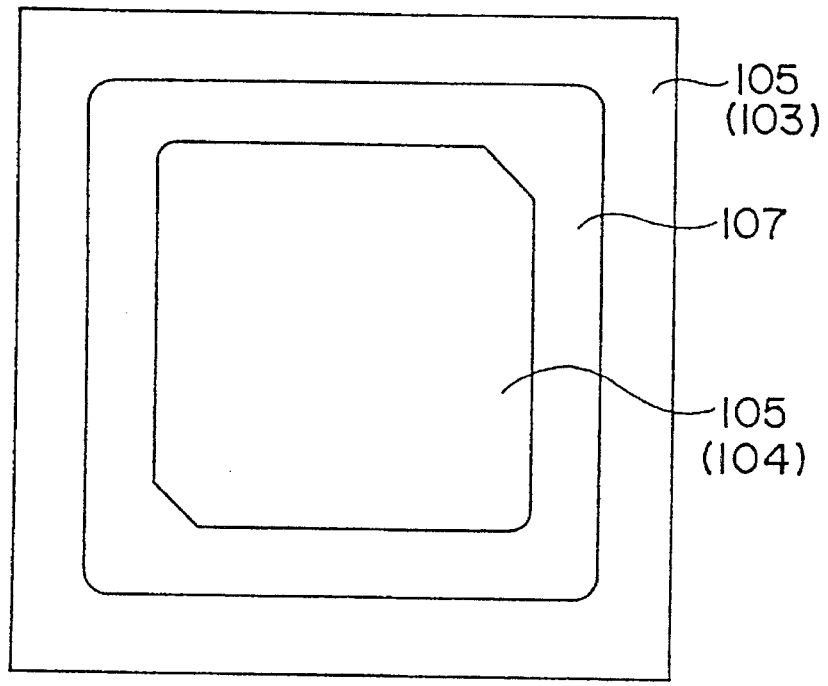
FIG. 1B is a plan view of it.
Figure 2:
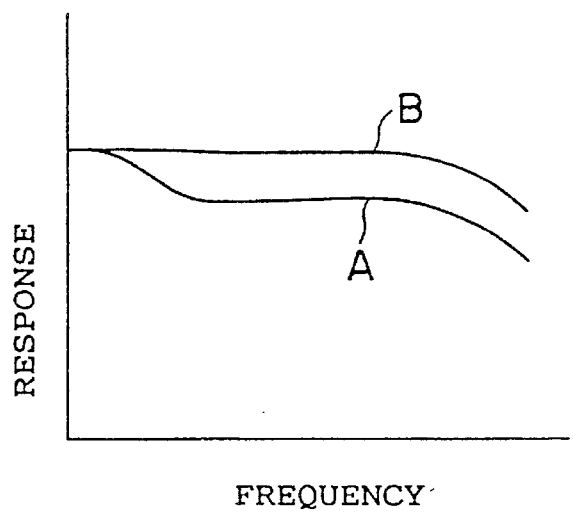
FIG. 2 is a characteristic graph showing a characteristic curve of a frequency vs. response characteristic which a light detecting device of a prior art has and an ideal characteristic curve of it.
Figure 7:
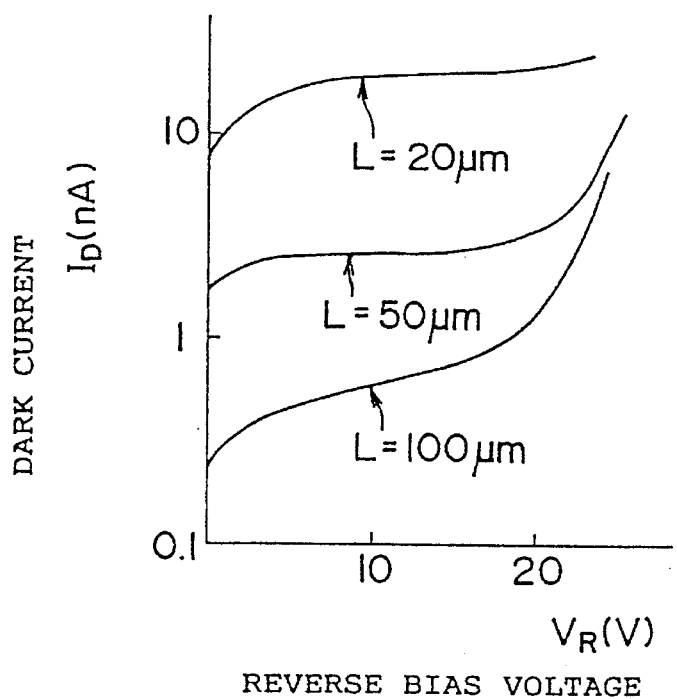
FIG. 7 is a characteristic graph showing relation between dark current and reverse bias voltage in the light detecting device of the prior art.
Figure 8:
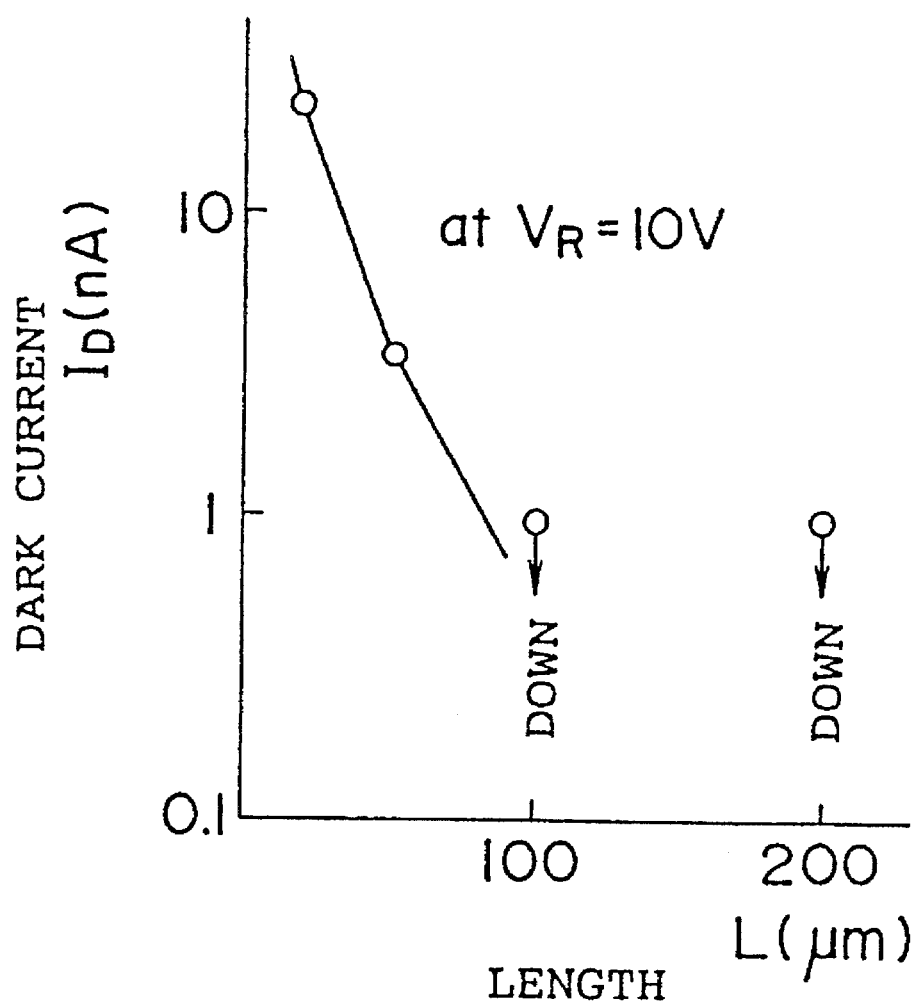
FIG. 8 is a characteristic graph showing relation between the dark current Id and distance L from the light receiving domain of the light detecting device of the prior art to the end face of it.

On the other hand, in a light detecting device of the prior art as shown in FIGS. 1A and 1B in which a $p^+$-type diffusion layer is not provided around the light detecting device, the distance L from the side face of the $p^+$-type InP layer 104 to the side face of the light detecting device needs to be lengthened up to 100 µm in order to obtain a dark current characteristic nearly equivalent to the characteristic in FIG. 6, as shown in FIG. 7. Furthermore, when the relation between the dark current and the distance L was investigated as setting the reverse bias voltage of the light detecting device shown in FIGS. 1A and 1B as 10 volt, a result as shown in FIG. 8 was obtained and it has been made known that the dark current cannot be kept small enough if the distance L is not set as 100 µm or more. when the distance L is set as 100 µm or more, there is a problem that the slow-response component is increased because of increase of diffusion length of the carriers generated outside the depletion layer.

Figure 9:
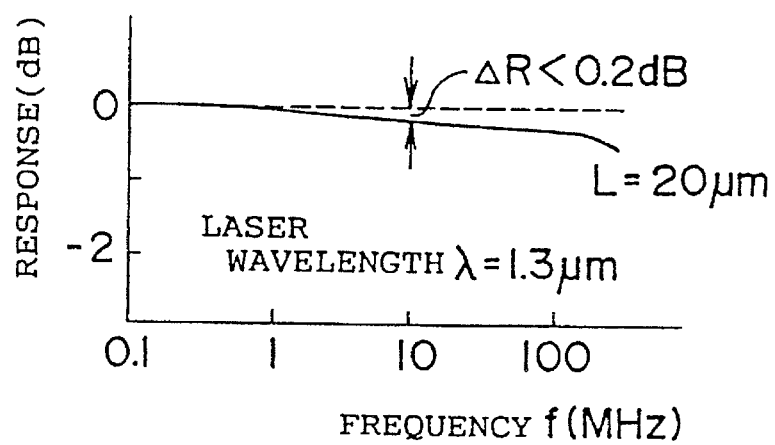
FIG. 9 is a graph showing a frequency vs. response characteristic of the light detecting device of the first embodiment of the present invention.
Figure 10:
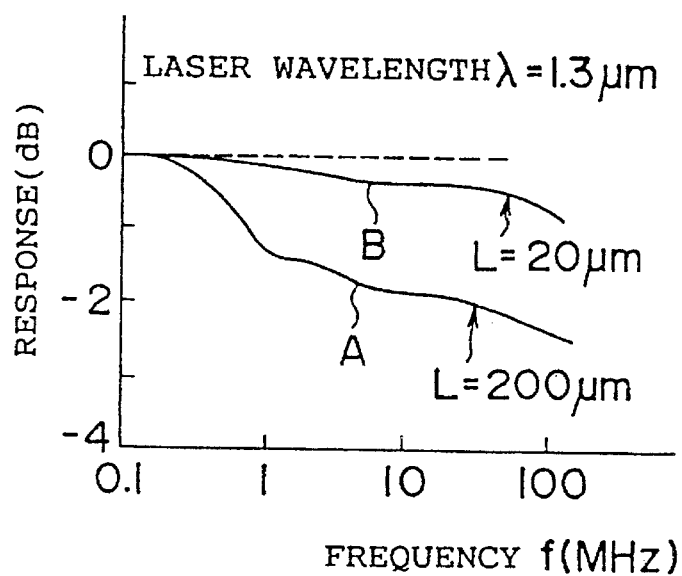
FIG. 10 is a graph showing a frequency vs. response characteristic of the light detecting device of the prior art.

Then, when a frequency vs. response characteristic of the light detecting device of this embodiment was investigated as setting the distance $L_0$ from the side face of the $p^+$-type InP layer 6 to the side face of the light detecting device as 20 µm, a response drop $\Delta R$ at 10 Mhz was 0.2 Db or less, and thus a characteristic of good flatness was obtained as shown in FIG. 9.

On the other hand, it has been made known that in the light detecting device shown in FIGS. 1A and 1B, when the distance L between the active area and the side face of the light detecting device is 200 µm, its characteristic curve is poor in flatness as shown by the curve A, and when the distance L is set as 20 µm, the curve is good in flatness. These matters are easily understood from a fact that the response is influenced by the time for electrons and holes generated outside the depletion layer to reach the active area S. Thus, it is known that the response characteristic is kept good by making the distance L short even if a $p^+$-type diffusion layer is not formed in the fringe of the light detecting device, but in this case a problem appears that the dark current cannot be reduced, as mentioned above.

Figure 3A:
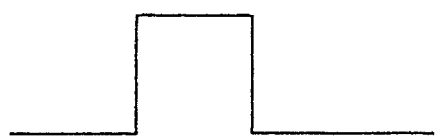
FIG. 3 is a figure of a pulse-shaped waveform of an incident light upon the light detecting device.
FIG. 3B is a waveform figure of the output signal of the light detecting device of the prior art.
Figure 3B:

From the above-mentioned matters, it is known that in the light detecting device of the embodiment, the dark current does not become greater in comparison with the prior art even if the distance $L_0$ from the end part of the $p^+$-type InP layer 6 to the side face of the device is shortened. According to the embodiment, the rise time and fall time of the device outputting current in responding to an incident light of pulse-shaped waveform as shown in FIG. 3A are shortened and the output current waveform is very little deteriorated.

The reason why the dark current is reduced is considered in the following.

It is thought that there are many nuclei of generation and recombination in the compound semiconductor layer of the end face of the light detecting device and since carriers generated in that layer flow into the depletion layer through the channel formed in the hetero interface between the InP layer 3 and the InGaAs layer 2, the dark current is generated.

And it is thought that, as shown in FIG. 4D, a barrier consisting of a pn junction is formed on the end face of the light detecting device when the $p^+$-type diffusion layer 7 is formed near the end face of the light detecting device, and this barrier obstructs the channel formed in the hetero interface to prevent the dark current from flowing into the depletion layer. As a result, it is possible to keep the dark current low as well as to make flat the frequency vs. response characteristic by shortening the distance $L_0$ between the active area S and the end face of the light detecting device.

Then, conditions for improving the frequency vs. response characteristic vary with the area of the light receiving face of the active area S. The conditions are satisfied by making the area of the domain (secondary light receiving domain) between the p-electrode 10 and the $p^+$-type diffusion layer 7 equal to or less than 1/10 of the area of the light receiving domain surrounded by the p-electrode 10.

By taking into consideration that carriers generated in the domain between the $p^+$-type InP layer 6 and the $p^+$-type diffusion layer 7 diffuse to both of the $p^+$-type InP layer 6 and the $p^+$-type diffusion layer 7, it will do that the area of the domain (effective secondary light receiving domain) being between the outer circumference of the p-electrode 10 and the ring-shaped virtual line passing in the middle of the belt between the outer circumference of the p-electrode 10 and the inner circumference of the $p^+$-type diffusion layer 7 is equal to or less than 1/10 of the area of the light receiving domain surrounded by the p-electrode 10.

The longer the distance for the carriers to diffuse is, the slower the response of the output current is. Therefore, the shorter the distance $L_1$ between the first and second impurity diffusion layers 6 and 7 is, the better the response is. The smaller a ratio of the number of carriers generated outside the depletion layer to the number of carriers generated in the depletion layer around the first impurity diffusion layer 6 is, the better the response in high frequency is improved.

In the case of designing the device so that the greatest value of monitor current cannot exceed a certain limit, it is expected that the area of the light receiving face is restricted to some degree. Therefore, an ingredient ratio of the carriers which cause a response delay of the output current can be reduced by making small the ratio of the area of the secondary light receiving domain or the effective secondary light receiving domain to the area of the light receiving face of the active area S.

(Second Embodiment)

Figure 11A:
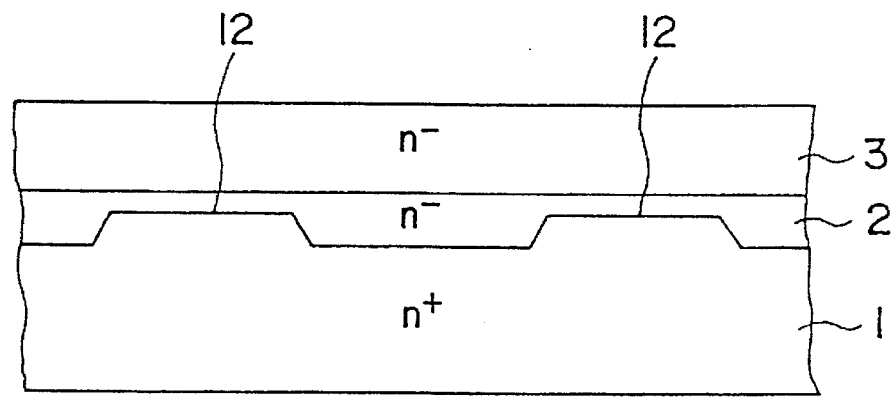
FIG. 11A is a cross-sectional view showing a layer structure of a light detecting device of a second embodiment of the present invention.
Figure 11B:
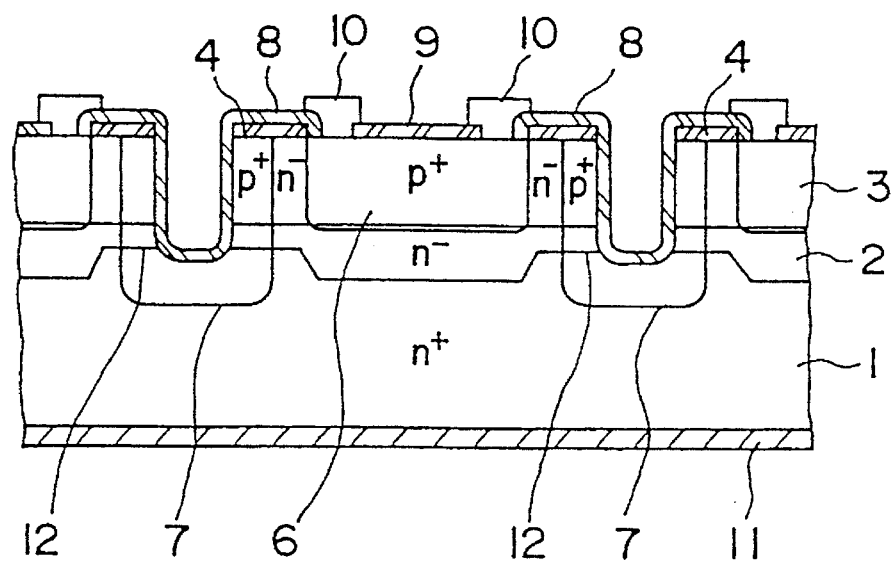
FIG. 11B is a cross-sectional view showing the light detecting device of the second embodiment of the present invention.

FIG. 11B is a cross-sectional view of a light detecting device of a second embodiment of the present invention.

In FIG. 11B, the same symbols as FIG. 4D show the same elements as FIG. 4D.

This light detecting device is the same as the first embodiment except that the n⁻-type InGaAs layer 2 is thinner in the outside of the p⁺-type InP layer 6.

In order to making partially thin the n⁻-type InGaAs layer 2, for example, a convex part 12 surrounding the active area S is formed on the main surface of the n⁺-type InP substrate 1, as shown in FIG. 11A. The convex part 12 can be easily formed by making the InP substrate 1 selectively thin by means of masks and etching technology.

In this manner, when the n⁻-type InGaAs layer 2 is formed on the InP substrate 1 having the convex part 12 so as to be 2.5 μm thick in the active area S, the upper surface of the n⁻-type InGaAs layer 2 becomes flat. And a light detecting device shown in FIG. 11B can be obtained by forming the n⁻-type InP layer 3 in the same way as the first embodiment and forming a trench 5 and diffusing impurities and forming an antireflection film 9 and then forming electrodes 10 and 11 in the same way as the first embodiment.

In such a light detecting device, since the n⁻-type InGaAs layer 2 where pairs of electrons and holes are liable to be generated by irradiation of light is made thin in the outside of the active area S, the number of carriers generated in the outside of the depletion layer is decreased. Thus, since the number of carriers generated inside the depletion layer is relatively increased, it is hard for the response characteristic to be deteriorated in a range of high frequency.

(Third Embodiment)

Figure 12:
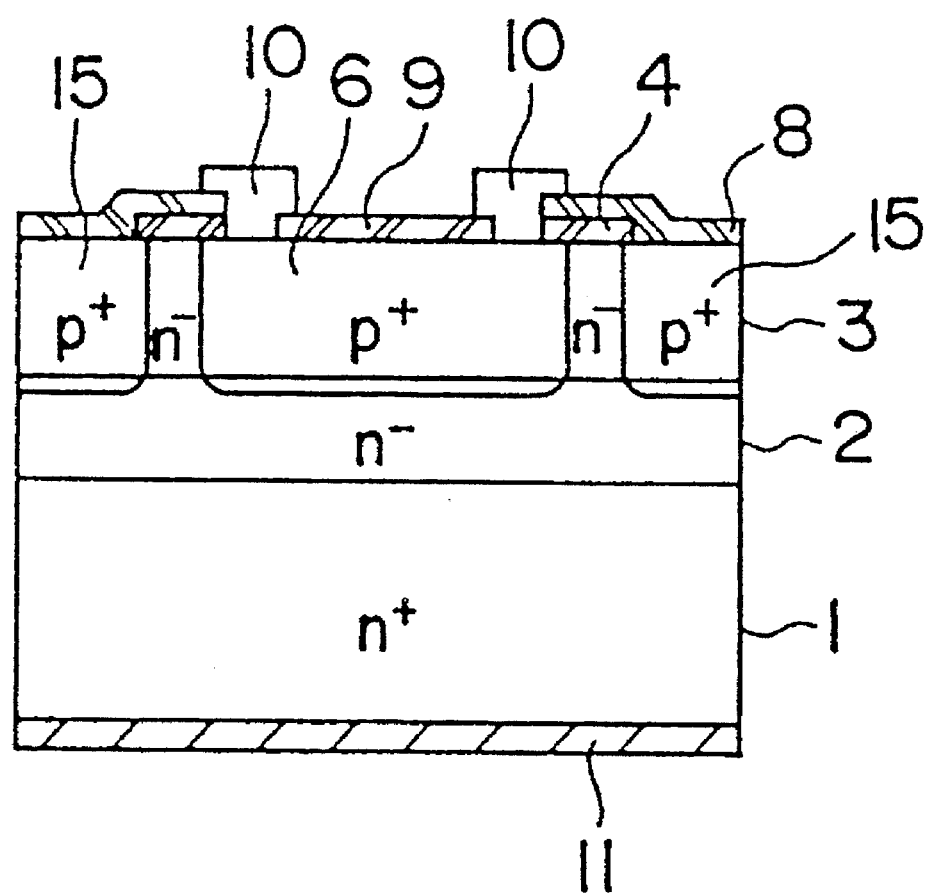
FIG. 12 is a cross-sectional view showing a light detecting device of a third embodiment of the present invention.

FIG. 12 is a cross-sectional view of a light detecting device of a third embodiment of the present invention, and the same symbols as FIG. 4D show the same elements as FIG. 4D.

The light detecting device shown in FIG. 12 is made different from the light detecting device shown in FIG. 4D by having a p⁺-type diffusion layer 15 formed around the end face of the light detecting device without having a trench 5 formed around the active area S.

The reason why the trench 5 is formed in the light detecting device shown in the first embodiment is that it is desired to make the p⁺-type diffusion layer 7 deeper than the p⁺-type InP layer 6 in the active area S. Namely, forming deeply the p⁺-type diffusion layer 7 after forming the trench 5 makes smaller the number of carriers generated in the n⁻-type InGaAs layer 2 around of the depletion layer.

As for reducing the dark current, since the same effect as the first embodiment can be obtained also with the light detecting device shown in FIG. 12, the structure shown in FIG. 12 is adequate for aiming at reduction of the dark current.

(Other Embodiments)

In the above-mentioned embodiments, an InP substrate is used, on which an InGaAs layer and an InP layer are formed, but the materials to be used are not particularly limited to them. For example, also in case that a photodiode made by forming an InGaAsP layer on an InP substrate or a photodiode using GaAs or the like is used, since the dark current can be decreased by diffusing an impurity of conductive type which is opposite to the substrate in polarity toward the outside of the photodiode, a light detecting device can be made small in size.

And in the above-mentioned embodiments, by setting a thickness of the first silicon nitride film around the active area S as ¼ of the wavelength λ of the light passing through the inside of it and setting the total thickness of the first and second silicon nitride films 4 and 8 as ½ of the λ, these films may be made act as reflection films. According to this method, an amount of light incident on the semiconductor layer outside the depletion layer is decreased and generation of electrons and holes in that area is suppressed, and as a result the frequency vs. response characteristic is improved.

In the above-mentioned embodiments, the first and the second P⁺-type impurity doped layer 6 and 7 are formed by thermal diffusion of impurity to non-doped layer, but they may be formed by ion implantation. Further, they may be formed by growing a doped layer.

What is claimed is:

1. A light detecting device comprising:
   a first semiconductor layer containing a first conductive type impurity;
   a second semiconductor layer formed on said first semiconductor layer, said second semiconductor layer containing the first conductive type impurity and having a density lower than that of said first semiconductor layer;
   a third semiconductor layer formed by introducing a second conductive type impurity into said second semiconductor layer to define an active region within said second semiconductor layer;
   a groove formed in said second semiconductor layer and surrounding said active region, said groove having a depth reaching to said first semiconductor layer; and
   a first semiconductor region containing the second conductive type impurity formed in said first, second and third semiconductor layers to surround a side surface of said groove, said first region being apart from said active region to form a pn junction therebetween.

2. A light detecting device as defined in claim 1, wherein said second semiconductor layer is composed of two compound semiconductor layers joined with each other through a heterojunction.

3. A light detecting device as defined in claim 1, wherein a surface area of said active region is 10 or more times as large as the area of said second semiconductor layer between said active region and said first semiconductor region.

4. A light detecting device as defined in claim 1, wherein an electrode is formed on said third semiconductor layer and along a periphery of said active region.

5. A light detecting device as defined in claim 4, wherein an area of said third semiconductor layer surrounded by said electrode is 10 or more times as large as an area of a region between said electrode and a ring-shaped virtual line passing in the middle of a belt between an outer circumference of said electrode and an inner circumference of said second semiconductor layer.

6. A light detecting device as defined in claim 1, wherein a part of the second semiconductor layer under said active region has a larger depth than that of a remaining part of said second semiconductor layer.

7. A light detecting device as defined in claim 1, wherein a light-transmitting protection film which is ¼ of a wavelength of an incident light in thickness is formed on the surface of said third semiconductor layer.

8. A light detecting device as defined in claim 1, wherein a light-transmitting protection film which is ¼ of a wavelength of an incident light in thickness is formed on the surface of said third semiconductor layer, and a lightreflecting protection film which is ½ of a wavelength of an incident light in thickness is formed on a surface of said second semiconductor layer outside said third semiconductor layer.

9. A light detecting device as defined in claim 1, wherein said first semiconductor layer is composed of an indium phosphide layer and said second semiconductor layer is composed of an indium gallium arsenide layer and an indium phosphide layer which are formed on said first semiconductor layer.

* * * * *

UNITED STATES PATENT AND TRADEMARK OFFICE
CERTIFICATE OF CORRECTION

PATENT NO. : 5,552,616
DATED : September 3, 1996
INVENTOR(S) : Masahiro KOBAYASHI It is certified that error appears in the above-indentified patent and that said Letters Patent is hereby corrected as shown below:

Col. 2, between lines 27 and 28, insert --Summary of the Invention--.

Signed and Sealed this

Twenty-first Day of January, 1997

Attest:

BRUCE LEHMAN

*Attesting Officer*      *Commissioner of Patents and Trademarks*